(12) United States Patent
Wang et al.

(10) Patent No.: US 7,211,882 B2
(45) Date of Patent: May 1, 2007

(54) LED PACKAGE STRUCTURE AND METHOD FOR MAKING THE SAME

(75) Inventors: Bily Wang, Hsin Chu (TW); Jonnie Chuang, Pan Chiao (TW); Heng-Yen Lee, Hsin Chu Hsien (TW); Hui-Yen Huang, Hsin Chu (TW)

(73) Assignee: Harvatek Corporation, Hsin Chu (TW)

( * ) Notice: Subject to any disclaimer, the term of this patent is extended or adjusted under 35 U.S.C. 154(b) by 24 days.

(21) Appl. No.: 11/085,100

(22) Filed: Mar. 22, 2005

(65) Prior Publication Data

US 2006/0214273 A1  Sep. 28, 2006

(51) Int. Cl.
*H01L 23/02* (2006.01)

(52) U.S. Cl. ............ 257/678; 257/676; 257/666

(58) Field of Classification Search ........... 257/678, 257/676, 666, 668
See application file for complete search history.

(56) References Cited

U.S. PATENT DOCUMENTS

| 5,309,460 | A | * | 5/1994 | Fujimaki et al. ............ 372/36 |
| 2002/0004251 | A1 | * | 1/2002 | Roberts et al. ............ 438/26 |
| 2003/0178711 | A1 | * | 9/2003 | Honda et al. ............ 257/676 |

* cited by examiner

*Primary Examiner*—Andy Huynh
*Assistant Examiner*—Thinh T Nguyen
(74) *Attorney, Agent, or Firm*—Rosenberg, Klein & Lee

(57) ABSTRACT

An LED package structure and a method for making the same are described. The LED package structure has at least one LED die, at least one metallic frame relating to the LED die, and an insulative body packaging the LED die and the metallic frame. The metallic frame has a first contact corresponding to the LED die and a second contact being relative to the first contact. The first and the second contacts inside the insulative body are electrically isolated from each other. The first contact has at least one recess around the LED die, and the second contact has at least one groove formed thereon.

7 Claims, 5 Drawing Sheets

LED PACKAGE STRUCTURE AND METHOD FOR MAKING THE SAME

BACKGROUND OF THE INVENTION

1. Field of the Invention

The present invention relates to a LED package structure, and particularly relates to a LED package structure adapted for lead-free solder technology in order to prevent a short circuit.

2. Description of Related Art

LEDs (Light Emitted Devices) are broadly applied to various electronic products. The LEDs are small and highly reliable, and can be mass produced and adapted for various displays, such as an indication light with low efficiency or outdoor advertising and traffic lights with high efficiency. In comparison with conventional lights, the LEDs have no filaments, have no toxic materials (mercury), have a low power consumption, and have a long service life. A conventional method for packaging the LEDs includes following steps. A plurality of metallic frames, connected one by one at intervals, are punched. A silver layer is electro-plated on the metallic frames, and LED dies are disposed on the frames as light sources. An anode contact and a cathode contact are formed on a respective one of the metallic frames by connecting at least two wires between the frame and the respective LED die. After that, the LED die with the frame is covered with epoxy as a whole transparent package. The European Union has adopted a directive (2002/95/EC RoHs announced) to restrict the use of certain hazardous substances in electrical and electronic equipments starting in Jul. 1, 2006, to minimize their threat to human health. The hazardous substances include lead, cadmium and mercury, and ploy-brominated biphenyls (PBB) and polybrominated diphenyl ethers (PBDE) using the same. As a result, every country has started to institute bans on these materials, and lead-free alloy is a basic requirement for electronic products. For information and electronic industries, the ban on hazardous substances has a huge influence on manufacturing, such as using solder without lead, guiding the lead-free solder technology into the processes for PCB and the contacts of components, and considering the lead-free joints inside the components. The conventional proportion for tin-lead solder is usually 63:37, and the melting point of this alloy is about 183° C. In contrast, the new lead-free solder has corresponding temperature characteristics, such as pure tin solder (Sn), tin solder with silver and copper (SnAgCu), tin solder with copper (SnCu) or tin solder with silver (SnAg), and has a melting point higher than that of the conventional solder. Not only must the relative profile of the heating process be modified corresponding to the new solder, but also the standards for tests and verifications must be altered to meet the environmental requirements. The most important point is that the wetting velocity of the lead-free solder is much higher than that of the conventional tin-lead solder, so that both the heating profile during the processes and the structure design of the component must be modified to overcome the shortages. The conventional package structure of the LED is given as an example, and is illustrated in FIG. 1. The LED has first and second contacts 1a and 2a separated from each other. A LED die 3a is disposed on the first contact 1a. Two wires 4a and 5a are connected between the LED die 3a, the first contact 1a and the second contact 2a. A package body 7a encloses the LED die 3a, and the first and the second contacts 1a and 2a, at the same time. If there is any seam or crack between the package body 7a and the first contact 1a or between the package body 7a and the second contact 2a, the lead-free solder permeates the package body 7a due to the too-high wetting velocity thereof. A short circuit or a failure mode will occur when the lead-free solder contacts the LED die 3a, or when the first and the second contacts 1a and 2a conducted with each other via the lead-free solder.

SUMMARY OF THE INVENTION

A LED package structure and a method for making the same can delay the permeation velocity of the lead-free solder, so as to avoid a short circuit between the anode and the cathode of the LED.

The LED package structure and a method for making the same can provide gradational-level contacts separated from each other, in order to control the efficiency and costs effectively.

A LED package structure includes at least one LED die, at least one metallic frame relating to the LED die, and an insulative body packaging the LED die and the metallic frame. The metallic frame includes a first contact carrying the LED die and a second contact. The first and the second contacts inside the insulative body are electrically isolated from each other. The first contact has at least one recess around the LED die, and the second contact has at least one groove formed therein.

A method for making a LED package structure includes:

(a) preparing a metallic frame;

(b) etching the metallic frame to a first predetermined depth, so as to form a recess and a groove;

(c) etching the metallic frame to a second predetermined depth, so as to separate the first contact from the second contact, where the recess is formed on the first contact and the groove is formed on the second contact;

(d) arranging an LED die on the first contact, so that the recess is arranged around the LED die;

(e) connecting a plurality of bonding wires between the LED die, the first contact and the second contact; and (f) packaging the LED die and the metallic frame via an insulative body; where the first and the second contacts are electrically isolated from each other via the insulative body.

To provide a further understanding of the invention, the following detailed description illustrates embodiments and examples of the invention. Examples of the more important features of the invention have thus been summarized rather broadly in order that the detailed description thereof that follows may be better understood, and in order that the contributions to the art may be appreciated. There are, of course, additional features of the invention that will be described hereinafter which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF PREFERRED EMBODIMENTS

Figure 1:
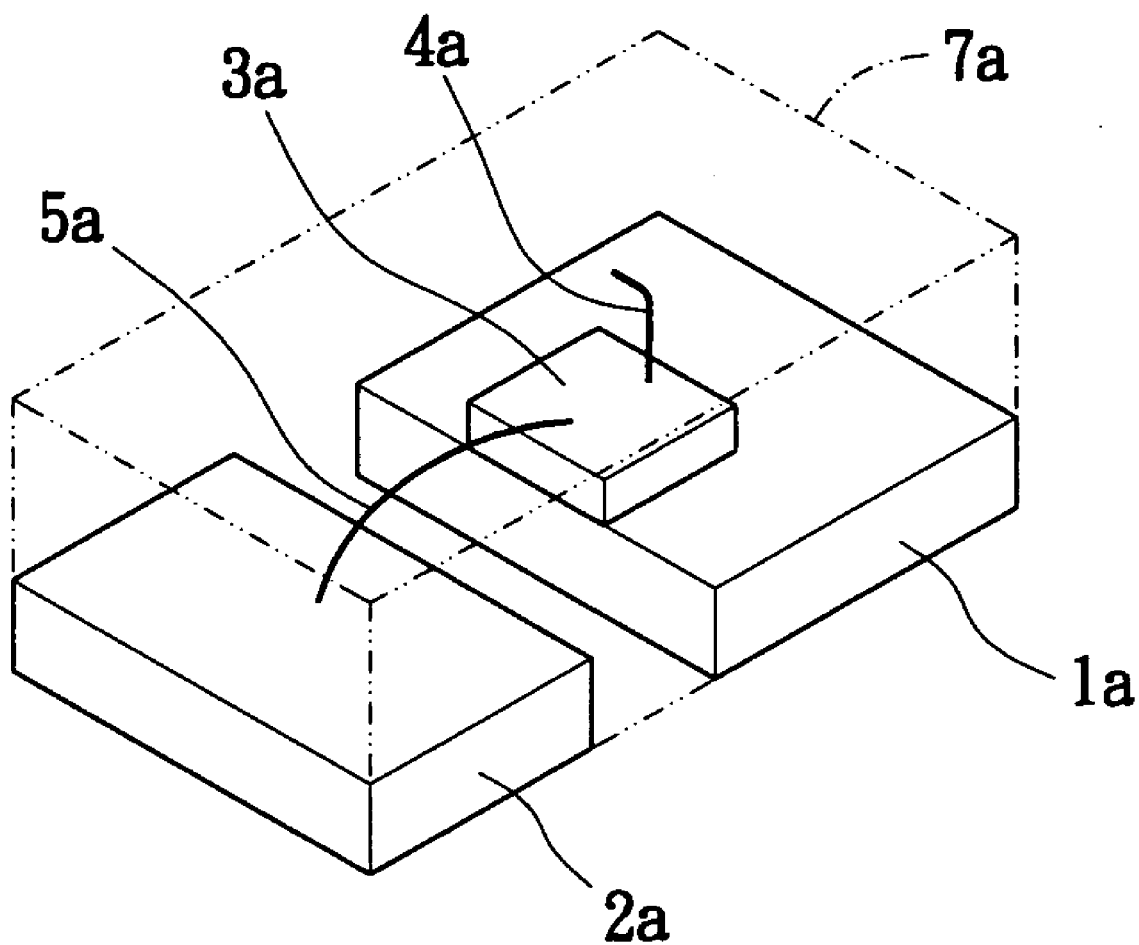
FIG. 1 is a perspective view of a conventional package structure of an LED.
Figure 2:
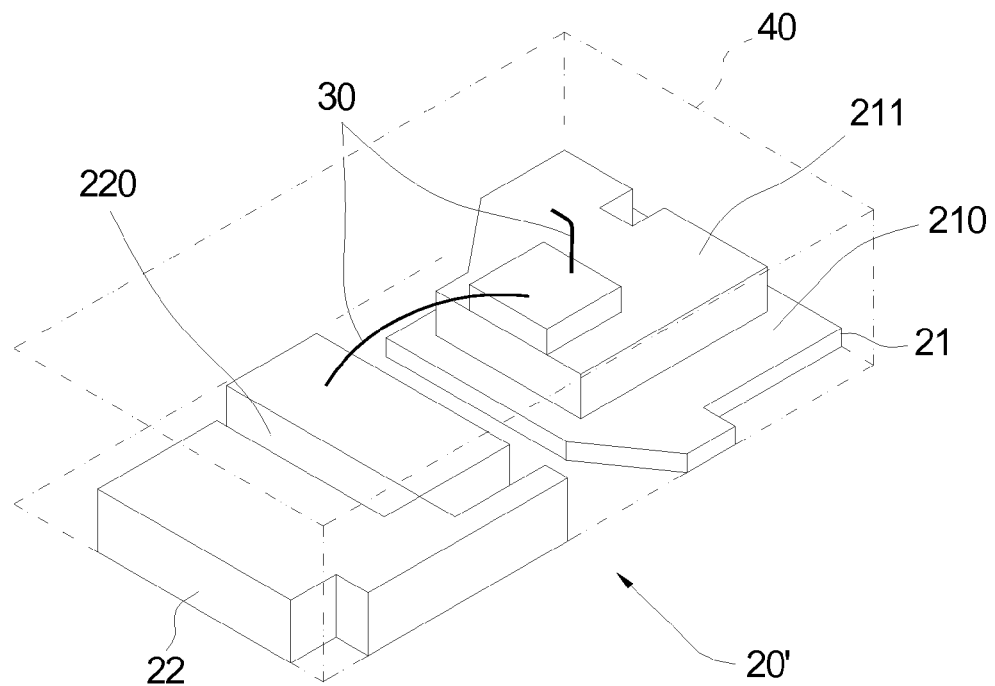
FIG. 2 is a perspective view of a package structure of an LED according to the present invention.
Figure 2A:
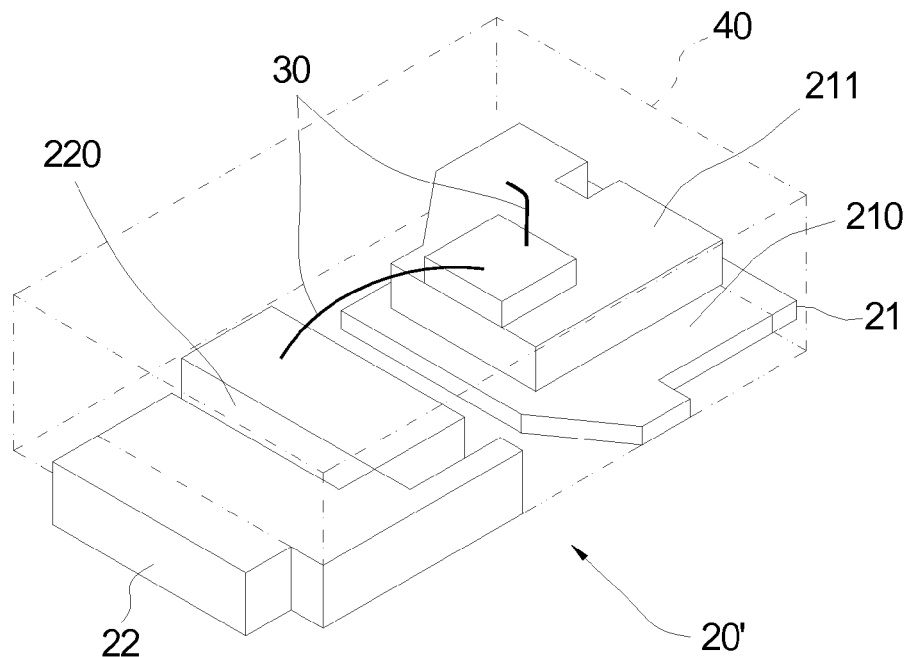
FIG. 2A is perspective view according to another angle of the package structure of the LED according to the present invention.
Figure 3:
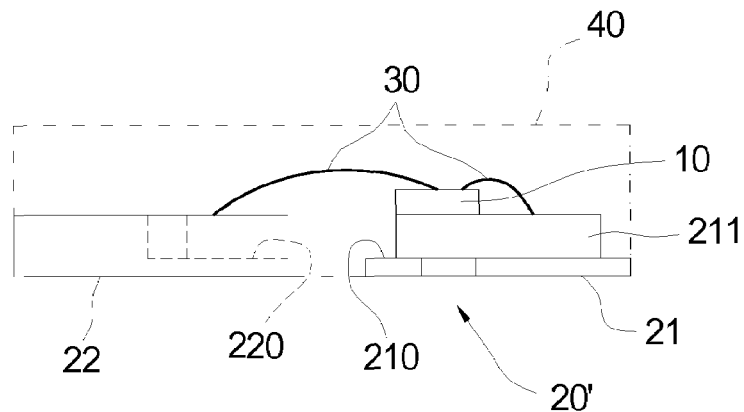
FIG. 3 is a side view of the package structure of the LED according to the present invention.

With respect to FIGS. 2 and 3, a LED package structure includes at least one LED die 10, at least one metallic frame 20 relating to the LED die 10, and an insulative body 40 packaging the LED die 10 and the metallic frame 20. The metallic frame 20 includes a first contact 21 carrying the LED die 10 thereon, and a second contact 22. The first and the second contacts 21 and 22 inside the insulative body 40 are electrically isolated from each other. The first contact 21 has at least one recess 210 around the LED die 10. The first contact 21 is shaped to form a post member 211 surrounded by the recess 210 and extending upwardly from the bottom portion of the first contact 21, as shown in FIGS. 2–3. The second contact 22 has at least one groove 220 formed therein. The recess 210 and the groove 220 are formed in a continuous or discontinuous manner. The first and the second contacts 21 and 22 are thus configured with gradational levels to delay the wetting velocity and to prevent a short circuit therefrom. The recess 210 or the groove 220 can have various configurations, including a U-shaped or an L-shaped profile. Besides, the insulative body 40 is made of epoxy. The insulative body 40 encloses the metallic frame 20 and the LED die 10 completely and is illustrated in FIG. 2; the insulative body 40 encloses the LED die 10 completely but covers parts of the first and second contacts 21 and 22 to expose them for soldering.

Figure 4:
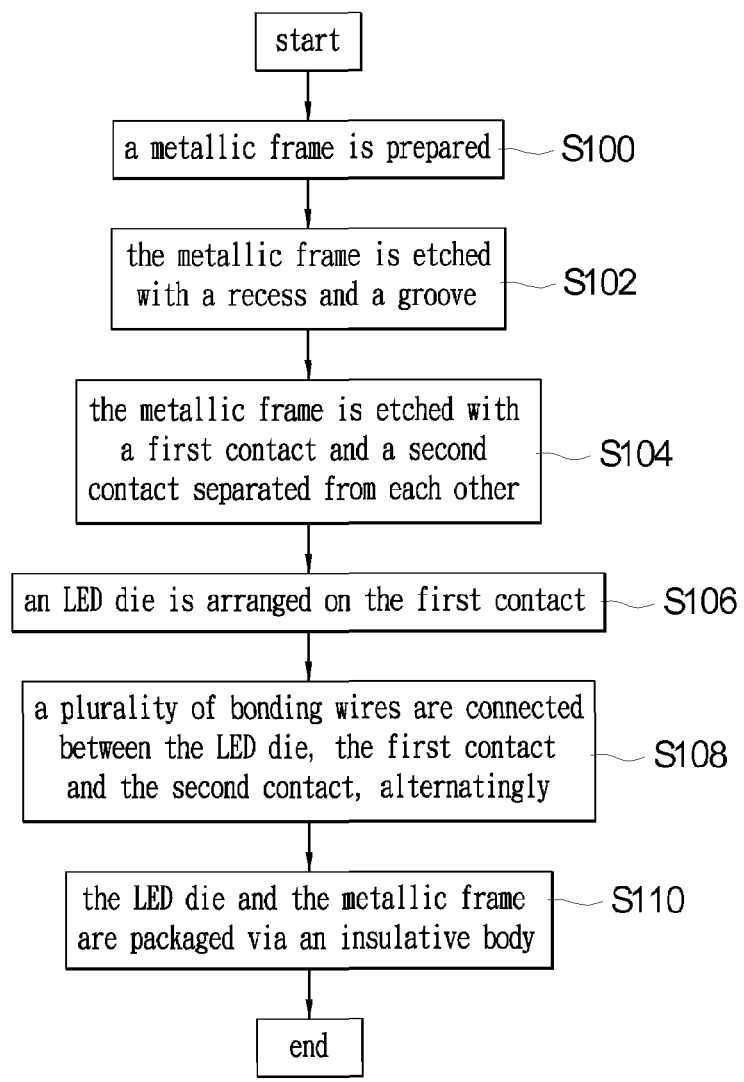
FIG. 4 is a flow chart of the package structure of the LED according to the present invention.
Figure 5A:
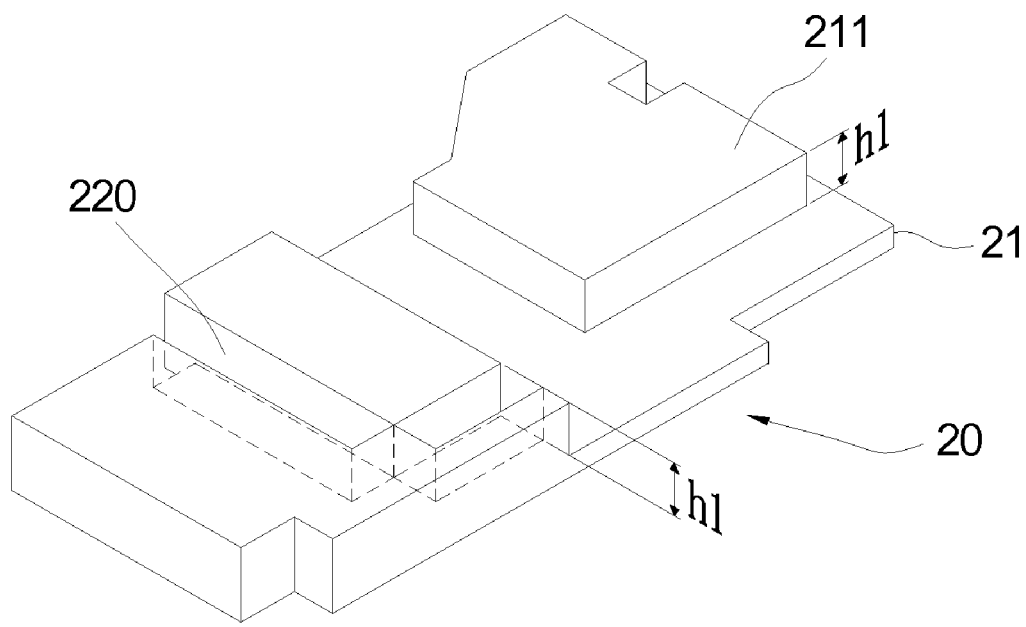
FIGS. 5A and 5B are the processing views of a metallic frame of the package structure of the LED according to the present invention.
Figure 5B:
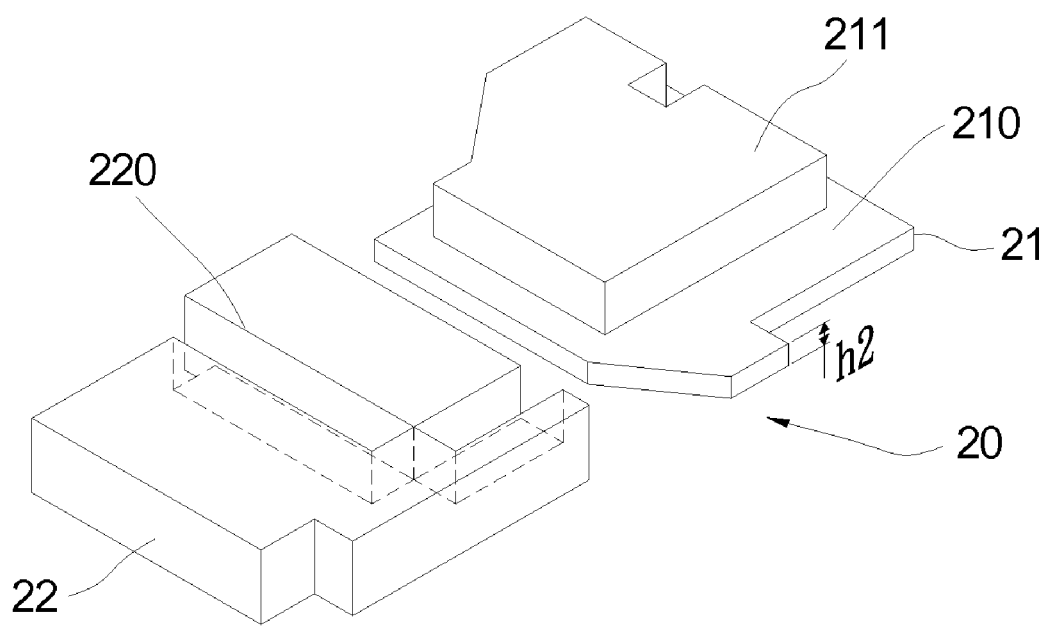

With respect to FIGS. 4, 5A to 5B, a method for making the package structure of the LED shown in FIG. 4 includes the following steps. A metallic frame 20 is prepared (step S100). The metallic frame 20 is etched to a first predetermined depth h1 to define the post member 211 on the bottom portion of the first contact 21 while the recess 210 is formed. The groove 220 is also formed, as illustrated in FIG. 5A (step S102). The groove 220 has a groove bottom and groove walls extending from the groove bottom. The metallic frame 20 is etched further to a second predetermined depth h2, so that a first contact 21 is created in spaced apart relationship with a second contact 22, thus forming an anode and a cathode, respectively (step S104). The metallic frame 20 is illustrated in FIG. 5B, wherein the recess 210 is formed on the first contact 21 and the groove 220 is formed on the second contact 22. As shown in FIGS. 2, 2A, 3 and 5A–5B, the top surface of the post member 211 has dimensions which are smaller than the dimensions of the bottom portion of the first contact. A LED die 10 is arranged on the top surface of the post member 211 of the first contact 21, and the recess 210 is arranged around the post member 211 (step S106). Bonding wires 30 are connected between the LED die 10 and the first contact 21, as well as between the LED die 10 and the second contact 22 (step S108). The LED die 10 and the metallic frame 20 are packaged via an insulative body 40 (step S110). The first and the second contacts 21 and 22 are electrically isolated from each other via the insulative body 40.

Figure 6:
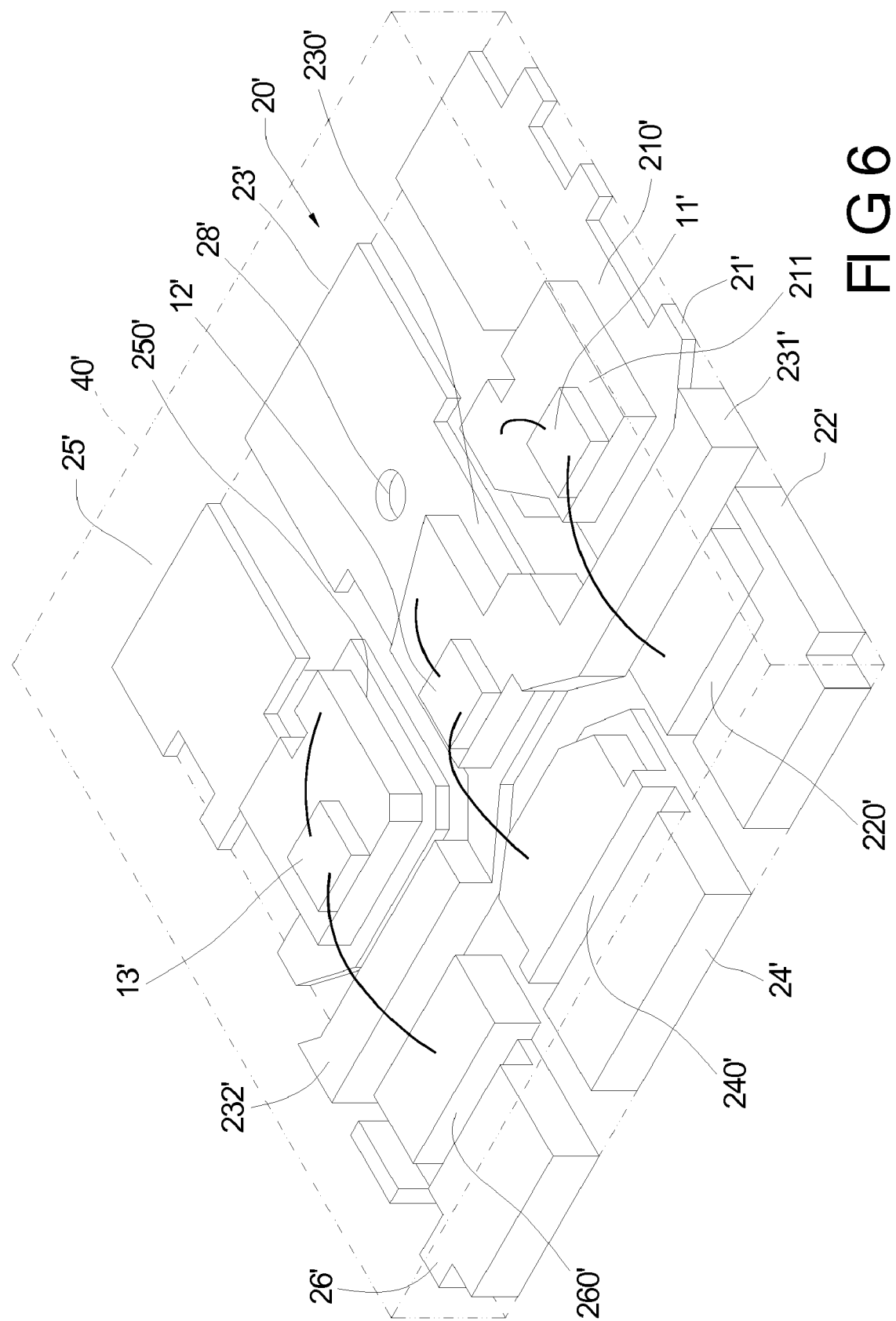
FIG. 6 is a perspective view of the package structure adapted for plural LED dies according to the present invention.

Referring to FIG. 6, the package structure adapted for plural LED dies is illustrated according to the present invention. A metallic frame 20' includes a pair of first and second contacts 21' and 22', a pair of third and fourth contacts 23' and 24', and a pair of fifth and sixth contacts 25' and 26'. An LED die 11' is disposed on the first contact 21', an LED die 12' is disposed on the third contact 23', and an LED die 13' is disposed on the fifth contact 25'. The first contact 21' has at least one recess 210' around the LED die 11', the third contact 23' has at least one recess 230' around the LED die 12', and the fifth contact 25' has at least one recess 250' around the LED die 13'. The second, fourth and sixth contact 22', 24' and 26' have at least one groove 220', 240' and 260', respectively. The bonding wires 31' connects between the LED die 11', the first contact 21', and the second contact 22'. The bonding wire 32' connects between the LED die 12', the third contact 23', and the fourth contact 24'. The bonding wire 33' connects between the LED die 13', the fifth contact 25', and the sixth contact 26'. The insulative body 40' packages the LED dies 11', 12', and 13', and the metallic frame 20', at the same time. Thus, the first and the second contacts 21' and 22', the third and the fourth contacts 23' and 24', and the fifth and the sixth contacts 25' and 26' are electrically isolated from each other via the insulative body 40'. For meeting the plural contacts mentioned above, the middle third contact 23' has two extending arms 231' and 232', stretching outwardly.

For additional strength between the insulative body 40' and the metallic frame 20', the metallic frame 20' further includes at least one through hole 28' formed therein. The through hole 28' can be formed in step S104.

According to the present invention, the advantages are:

1. A short between the anode and the cathode of the LED can be prevented by increasing the distance for the lead-free solders, in order to delay the wetting velocity thereof.

2. The recess of the first contact and the groove of the second contact for the first advantage are formed in the etching process, and the efficiency and costs thereof can be controlled effectively.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A LED package structure, comprising:
    at least one metallic frame, said at least one metallic frame including a first contact and a second contact,
    wherein said first contact includes:
    a bottom portion,
    a post member extending from said bottom portion a predetermined height above said bottom portion, and
    at least one recess surrounding said post member and defining a top surface thereof, said top surface having an area smaller than an area of said bottom portion, and
    wherein said second contact includes at least one groove formed therein, said groove having a groove bottom and a pair of groove walls extending from said groove bottom;
    at least one LED die positioned on said top surface of said post member; and
    an insulative body packaging said at least one LED die and said at least one metallic frame, wherein the first and the second contacts inside the insulative body are electrically isolated from each other.

2. The LED package structure as claimed in claim 1, wherein a height of the second contact is substantially identical to a height of said post member.

3. The LED package structure as claimed in claim 1, wherein the insulative body encloses completely said at least one LED die and at least partially said first and second contacts.

4. The LED package structure as claimed in claim 1, wherein either of said at least one recess and said at least one groove is formed in a continuous or discontinuous manner.

5. The LED package structure as claimed in claim 1, wherein either of said at least one recess and said at least one groove has a U-shaped or an L-shaped profile.

6. The LED package structure as claimed in claim 1, wherein the first contact has at least one through hole formed therein, so as to engage with the insulative body.

7. The LED package structure of claim 1, wherein said at lest one groove has one or two side openings formed therein.

* * * * *